United States Patent [19]

Douglas

[11] Patent Number: 5,100,499
[45] Date of Patent: Mar. 31, 1992

[54] COPPER DRY ETCH PROCESS USING ORGANIC AND AMINE RADICALS

[75] Inventor: Monte A. Douglas, Coppell, Tex.

[73] Assignee: Texas Instruments Incorporated, Dallas, Tex.

[21] Appl. No.: 722,375

[22] Filed: Jun. 25, 1991

Related U.S. Application Data

[63] Continuation of Ser. No. 453,543, Dec. 20, 1989, abandoned.

[51] Int. Cl.$^5$ .................. B44C 1/22; B29C 37/00; C23F 1/02
[52] U.S. Cl. .................. 156/635; 156/643; 156/646; 156/656; 156/659.1; 156/666; 156/902; 156/904; 252/79.1
[58] Field of Search ............ 156/635, 643, 646, 656, 156/659.1, 666, 901, 902, 904; 252/79.1

[56] References Cited

U.S. PATENT DOCUMENTS

| | | | |
|---|---|---|---|
| 4,490,210 | 12/1984 | Chen et al. | 156/643 |
| 4,557,796 | 12/1985 | Druschke et al. | 156/643 |
| 4,919,750 | 4/1990 | Bausmith et al. | 156/643 |

Primary Examiner—William A. Powell
Attorney, Agent, or Firm—B. Peter Barndt; Richard Donaldson; William E. Hiller

[57] ABSTRACT

An etch process for etching copper layers that is useable in integrated circuit fabrication is disclosed which utilizes organic and amine radicals to react with copper, preferrable using photoenergizing and photodirecting assistance of high intensity ultraviolet light, to produce a product which is either volatile or easily removed in solution. The process is anisotropic.

24 Claims, 2 Drawing Sheets

COPPER DRY ETCH PROCESS USING ORGANIC AND AMINE RADICALS

This application is a continuation of application Ser. No. 07/453,543, filed Dec. 20, 1989, now abandoned.

CROSS REFERENCE TO RELATED APPLICATIONS

This application is related by subject matter to U.S. patent application Ser. No. 07/453,549 entitled Copper Dry Etch Process having common title, inventor, and assignee as the instant application and filed concurrently herewith.

FIELD OF THE INVENTION

The invention concerns methods and apparatuses for etching copper layers, especially copper layers overlying a layer of a second material, such as found in printed circuit fabrication and the seed copper layers used in printed circuit fabrication and in integrated circuit metallization layers, by photo-formed and photo-activated organic and amine radicals.

BACKGROUND OF THE INVENTION

Patterning of a relatively thick copper layer or a thinner seed copper layer has been a requirement of printed circuit fabrication techniques. More recently, it has been desired to pattern thin copper layers in integrated circuit fabrication technology. Aluminum has been commonly used successfully in integrated circuit technology to form conductive leads between and across active elements of the integrated circuits, partly because aluminum has been found to be easily patterned by several techniques. However, as discussed by Hu, et al., in "Diffusion Barrier Studies for CU", 1986 *IEEE V-MIC Conference*, 9-10 June 1986, pages 181-187, copper offers several advantages over aluminum metallization layers in integrated circuits such as higher conductivity, better electromigration resistance, and reduced power consumption. As further discussed, however, in the same aricle, copper has a greater tendency to diffuse into silicon than aluminum. Satisfactory solution to this problem has, nevertheless, been found by the use of diffusion barriers between the solution and other layers of integrated circuits and the copper metallization layers.

Patterned etching of copper films has been accomplished, primarily in printed circuit fabrication, by wet processes wherein a protective, patterned film, such as a photoresist is applied to a copper layer and then a strong liquid etchant, usually an acid, is applied to etch the exposed copper down to the base material. This process presents several problems when applied to integrated circuit fabrication, such as the following. The wet processes are inherently "dirty" in that contaminants in the etchant can be introduced to the integrated circuit wafer. The wet etchants required are generally hazardous to operators by contact and inhalation of vapors produced thereby. Etching of copper requires etchants, high temperatures, or both which may damage the other layers of an integrated circuit. Etching of copper by wet processes is isotropic, making copper metallization for VLSI circuits extremely difficult due to inadequate critical dimension definition and control. Disposal of the waste products of wet etch processes is becoming more expensive.

Therefore, because of the increased desire to utilize copper metallization in integrated circuits and the problems inherent in known wet etch techniques, it has become more important to develop more effective etching processes and equipment for etching copper layers, especially as used in integrated circuit fabrication.

Sputtering techniques are utilized presently to remove copper from copper-doped aluminum films and therefore may have application to removing copper films. However, sputtering, the physical dislodging of copper atoms and clusters by high energy ion bombardment, doe not exhibit selective removal of various films and will result in extreme buildup of residue in the reaction chamber, since the copper is not converted to a volatile species. Also, sputter removal techniques are relatively slow, difficult to control and exhibit insufficient selectivity to patterned masking layers and underlying thin films.

Dry etch processes, involving a plasma to form reactive agents such as a halogen, an amine, or an organic radical which react and form a volatile copper product could be an approach to an effective etch process for copper which solves some of the problems encountered in other processes, particularly the redeposit of residue on reaction chambers. However, due to the known high melting and boiling points of the copper compounds that would be formed, coupled with the normal range of substrate temperatures associated with these plasma processes, it has been thought that volatilization would not occur and that these processes would be unsuccessful. Moreover, a plasma discharge produces a wide range of dissociated, reactive products that can combine homogeneously or heterogeneously to form a polymer residue. For example, hydrocarbon and chlorocarbon discharges produce heavy residues of polymer. The residue generates many particles. Also, if the reaction product of these processes does not volatize, it has been thought that the surface reaction would prevent further reaction of the copper bulk material below this surface. Some investigation of the reaction of chlorine with copper has been done as discussed by W. Sesselmann, et al., in "The Interaction of Chlorine with Copper", *Surface Science*, vol. 176(1986) pages 32-90. Some early investigation of ion etching of copper films is discussed by Schwartz, et al, in "Reactive Ion Etching of Copper Films", *Journal of the Electochemical Society*, vol. 130, number 8(1983), pages 1777-1779.

SUMMARY OF THE INVENTION

The Inventor has found that dry or dry/wet processes using organic and amine radicals generated and activated by light and exposed to a copper film are effective processes for etching copper metallization layers, even in the environment of integrated circuit fabrication.

The Inventor has discovered that, especially at higher substrate or chamber temperatures, anisotropic, volatilization of the copper amine or organic reaction product from unmasked areas is possible to achieve anisotropic dry etching of copper film. And, further, even when the copper amine or organic product is not volatile, complete reaction of a bulk copper film with the radical directionally or anisotropically occurs in unmasked areas to produce a copper amine or organocopper reaction product which is easily removed anisotropically by a solvent or water wash. Most importantly, the copper amine or organic product is formed anisotropically so whether the product is removed by volatilization or wet solution, the patterned copper is not removed or undercut isotropically.

It is therefore an object of the invention to provide an etch process for copper films that is useful in fabrication processes for integrated circuits.

It is an object of the invention to sustain patterned critical dimension definition and control.

Further, it is an object of the invention to provide an etch process for copper films which does not require a strong wet etchant.

And it is also an object of the invention to provide photo-induced directional diffusion.

It is a further object of the invention to provide an etch process for copper films which avoids the contamination of process chambers and extremely low etch selectivity to mask and underlying layers caused by sputtering techniques.

It is a further object of the invention to provide an etch process for copper which is, essentially, a dry process. These and further benefits of the invention will be evident to one of ordinary skill in view of the drawing figures and detailed description of the embodiments to follow.

It is a further object of the invention to provide anisotropic etch techniques for copper films.

BRIEF DESCRIPTION OF THE DRAWING FIGURES

DETAILED DESCRIPTION OF THE INVENTION

Figure 1:
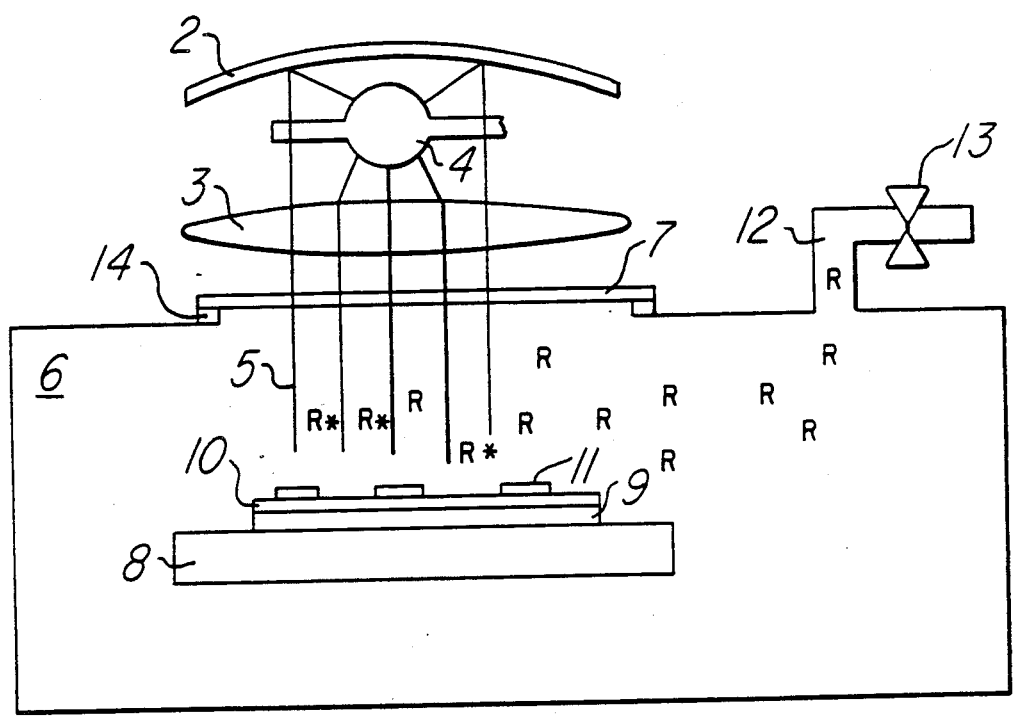
FIG. 1 is a schematic drawing of an embodiment of a reaction chamber as used in the process according to the instant invention.

Referring to FIG. 1, there is shown a sealed chamber 6 having a substrate holder 8, which normally has temperature controlled heating elements (not shown) for heating a substrate placed thereon. Shown on the substrate holder 8, is a drawing representation, not to scale, of a typical integrated circuit wafer having a substrate 9, for example a single crystal silicon substrate, a copper metal layer 10, and a patterned mask 11. Mask 11, in integrated circuit fabrication processes, would typically be a photo sensitive mask material of known types which is patterned and etched according to well-known photolithographic techniques. However, mask 11 may also be fabricated by techniques other than photolithography. Substrate holder 8 may contain controlled heating elements (not shown) for the purpose of heating the substrate 9 to a desired process temperature. The process temperature desired may be determined according to the several factors. If a high degree of volatilization or complete volatilization of the combinative copper product is desired, a high process temperature is required. The exact temperature required is dependent upon the radical agent used. However, factored against utilization of such high process temperatures is the fact that the integrated circuit wafers processed may be damaged or destroyed by the temperatures required for significant volatilization. Of course, printed circuit substrates may not be so damaged by high process temperatures.

Again, referring to FIG. 1, a high intensity light source 4, such as a filtered ultra violet source, e.g., a 1000 watt Hg/Xe lamp, is located above the chamber 6. Focusing elements 2 and 4 are arranged to direct the high intensity light through transparent window 7, which may be a quartz window, onto the surface of the masked copper layer 10 and 11. The window 7 is sealed, as by "0"-ring 14. It is pointed out that, although FIG. 1 shows the high intensity light directed perpendicularly to the wafer, it has been found to be also effective if the chamber is arranged so that the light is directed at other angles to, and even parallel to, the wafer.

Inlet part 12, having valve 13, allows reactant R to enter the chamber 6 and contact the wafer 9, 10 and 11. Reactant R is an amine radical or organic radical, such as alkyl or phenyl radicals. The radical may be produced from an organic or amine compound, e.g., $CH_3I$ by photochemical dissociation, microwave afterglow dissociation or plasma discharge dissociation, for example, as is known in the art. Also the radical may be produced within the chamber by photochemical dissociation by, for example, introducing $CH_3I$ to the high intensity ultraviolet light 5 from source 4. The organic or amine radical R is then light activated by high intensity light 5 and contacts the copper layer 10 and mask layer 11.

The etch process which occurs within the chamber 6, will follow two different methodologies, depending primarily upon the temperature at which the process occurs and the reactant used. An amine or organic parent molecule, P, is photo-dissociated to form radical species R. As the copper layer 10 is contacted by reactant radical R, the copper and radicals react at the copper surface to form a copper amine or organic copper compound. These reactions may be represented as:

I. RADICAL FORMATION

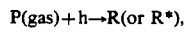

P(gas)+h→R(or R*), where P is Parent molecule, R is an amine or organic radical, h is light energy, and R* is a light-activated radical.

II. RADICAL FORMATION WITH Cu

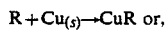

R+Cu$_{(s)}$→CuR or,

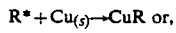

R*+Cu$_{(s)}$→CuR or,

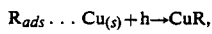

R$_{ads}$ ... Cu$_{(s)}$+h→CuR, where (g) is gas, h is light energy, (s) is solid.

III. CuR REMOVAL

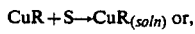

CuR+S→CuR$_{(soln)}$ or,

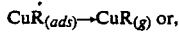

CuR$_{(ads)}$→CuR$_{(g)}$ or,

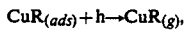

CuR$_{(ads)}$+h→CuR$_{(g)}$, where S is solvent, (soln) is solution, h is light energy and (ads) is adsorbed.

If CuR, under the conditions of the reaction, is volatile, then the product CuR is released as a vapor and may be pumped as a vapor from the chamber 6.

If however, product CuR is not volatile, the product remains on the copper layer surface. Surprisingly however, the inventor has found that the reaction continues throughout the copper layer to form CuR. The surface reaction does not block reaction beneath the surface under the process conditions disclosed. After the reaction has then occurred throughout the copper layer 10, the resulting copper amine or organo-copper product CuR can be washed away using an appropriate solution such as water or acetone. The copper amine or organo-copper product will easily enter into solution.

Moreover, the diffusion of R in CuR to react further with copper is photo-induced directional diffusion.

Figure 2A:
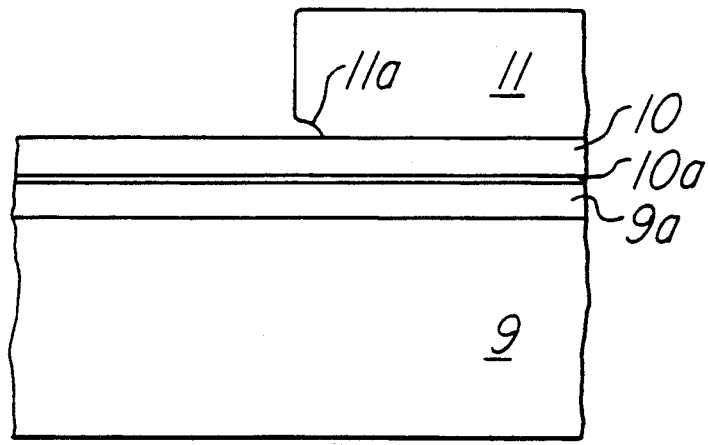
FIGS. 2a and 2b are drawings representative of side views by electron microscopy of a semiconductor wafer during two stages of the etch process according to the instant invention.
Figure 2B:
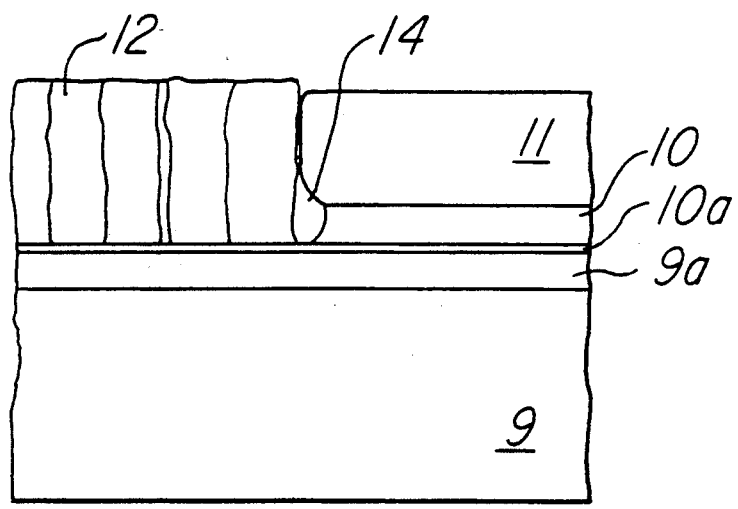

FIGS. 2a and 2b show a representation of an integrated circuit wafer using a copper metallization layer during two stages of the process according to the invention as has been observed by electron microscopy. The wafer of FIG. 2a is shown before the etch process showing a silicon substrate 9, a silicon dioxide layer 9a, a titanium tungsten barrier layer 10a, and a copper layer 10.

A mask layer 11 is applied and patterned by well-known photolithography methods, for example, or by other known means. In this instance, a cantilevered resist overhang 11a is generated by an immage-reversal development process.

FIG. 2b depicts the same wafer after etch processing steps have been accomplished, as in the chamber of FIG. 1, under the following conditions. The wafer (9, 10 and 11) may be deglazed as by a dilute nitric acid. A 1000 watt Mercury-Xenon lamp with a water filter was directed upon the wafer 9, 10 and 11. The water filter serves to extract most of the infrared light above 1.3 microns while passing the deep ultraviolet light, down to about 200 nm. The light was directed orthogonally to the wafer. The wafer was heated to a temperature of 25 C. $CH_3I$, was introduced to the chamber, at 10 torr, at the rate of 100 sccm. The $CH_3$ was dissociated by the photo energy of the light source. The wafer was exposed to the CH3 radical for 15 minutes. After this time, FIG. 2b shows that the entire copper layer which was not masked has reacted and expanded to about three times its previous thickness. The resulting product layer film 12 was found to be $Cu(CH_3)_2$. Further, a void 14 can be noted. The resulting film may be removed by a simple wash step. The reaction products are typically removed with an acetone or water wash.

It is pointed out that the invention has been disclosed with respect to embodiments which are not intended to be limiting. It is intended that the parameters suggested in these embodiments may be varied within wide latitude to achieve desired results. The scope of the invention, therefore, is intended to be limited only by the appended claims and equivalent modifications.

I claim:

1. A process for etching a copper layer on a substrate to form patterned conductors comprising the steps of:
    masking areas of said copper layer which areas are not intended to be etched;
    introducing an organic parent molecule to said copper layer, irradiating said organic parent molecule with high intensity ultraviolet light to produce organic radicals, the organic radicals for reacting with said copper layer to form an organic reaction product.

2. The process of claim 1 further comprising the step of:
    heating said substrate to a temperature at which said organic copper reaction product is substantially volatile.

3. The process of claim 1 further comprising the step of:
    washing said substrate to remove said organic copper reaction product.

4. The process of claim 2 wherein said substrate is heated above 200° C.

5. The process of claim 1 wherein said organic parent molecule is a alkane.

6. A process for etching a copper layer on a substrate to form patterned conductors comprising the steps of:
    masking areas of said copper layer which areas are not intended to be etched;
    introducing an amine parent molecule to said copper layer, irradiating said amine parent molecule with high intensity ultraviolet light to produce amine radicals, the amine radicals for reacting with the copper layer to form a copper amine reaction product.

7. The process of claim 6 further comprising the step of:
    heating said substrate to a temperature at which said copper amine reaction product is substantially volatile.

8. The process of claim 6 further comprising the step of:
    washing said substrate to remove said copper amine reaction product.

9. The process of claim 7 wherein said substrate is heated above 200° C.

10. The process of claim 6 wherein said amine parent molecule is an ammonia based compound.

11. A process for etching a copper layer on a substrate to form patterned conductors comprising the steps of:
    masking areas of said copper layer which areas are not intended to be etched;
    producing an organic radical;
    introducing said organic radical to said copper layer; and
    exposing the copper layer and organic radical to an energy source, the organic radical reacting with said copper layer to form an organic copper reaction product.

12. The process of claim 11 wherein the organic radical is produced by exposing an organic parent molecule to a photochemical environment.

13. The process of claim 11 wherein the organic radical is produced by exposing an organic parent molecule to a microwave afterglow environment.

14. The process of claim 11 wherein the organic radical is produced by exposing an organic parent molecule to a plasma discharge environment.

15. The process of claim 11 wherein the organic radical is produced by exposing the organic parent molecule to a high temperature environment.

16. The process of claim 11 and further comprising the step of:
    removing said copper reaction product by photo-induced removal of the reaction product.

17. A process for etching a copper layer on a substrate to form patterned conductors comprising the steps of:
    masking areas of said copper layer which areas are not intended to be etched;
    producing an amine radical;
    introducing said amine radical to said copper layer;
    exposing the copper layer and amine radical to an energy source, the amine radical reacting with said copper layer to form an amine copper reaction product.

18. The process of claim 17 wherein the amine radical is produced by exposing an amine parent molecule to a photochemical environment.

19. The process of claim 17 wherein the amine radical is produced by exposing an amine parent molecule to a microwave afterglow environment.

20. The process of claim 17 wherein the amine radical is produced by exposing an amine parent molecule to a plasma discharge environment.

21. The process of claim 17 wherein the amine radical is produced by exposing the organic parent molecule to a high temperature environment.

22. The process of claim 17 and further comprising the step of:
   removing said copper reaction product by photo-induced removal of the reaction product.

23. The process of claim 1 and further comprising the step of:
   removing said organic reaction product by photo-induced removal of the reaction product.

24. The process of claim 6 and further comprising the step of:
   removing said copper amine reaction product by photo-induced removal of the reaction product.

* * * * *